(12) United States Patent
Kumar et al.

(10) Patent No.: US 8,865,518 B2
(45) Date of Patent: Oct. 21, 2014

(54) METHODS FOR FORMING RESISTIVE SWITCHING MEMORY ELEMENTS

(71) Applicant: Intermolecular Inc., San Jose, CA (US)

(72) Inventors: Nitin Kumar, Fremont, CA (US); Tony P. Chiang, Campbell, CA (US); Chi-I Lang, Cupertino, CA (US); Zhi-Wen Wen Sun, Sunnyvale, CA (US); Jihong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/909,324

(22) Filed: Jun. 4, 2013

(65) Prior Publication Data

US 2013/0260508 A1 Oct. 3, 2013

Related U.S. Application Data

(62) Division of application No. 13/096,719, filed on Apr. 28, 2011, now Pat. No. 8,476,107, and a division of application No. 11/702,966, filed on Feb. 5, 2007, now Pat. No. 7,972,897.

(51) Int. Cl.
*H01L 21/00* (2006.01)

(52) U.S. Cl.
USPC .................. 438/104; 438/171; 438/678

(58) Field of Classification Search
USPC .................... 438/104, 171, 678
See application file for complete search history.

(56) References Cited

U.S. PATENT DOCUMENTS

| | | | | |
|---|---|---|---|---|
| 7,629,198 B2 * | 12/2009 | Kumar et al. | ................. | 438/104 |
| 7,678,607 B2 * | 3/2010 | Chiang et al. | ................. | 438/104 |
| 7,704,789 B2 * | 4/2010 | Sun et al. | ....................... | 438/104 |
| 7,812,404 B2 * | 10/2010 | Herner et al. | ................. | 257/390 |
| 7,863,087 B1 * | 1/2011 | Kumar et al. | ................. | 438/104 |
| 7,875,871 B2 * | 1/2011 | Kumar et al. | ..................... | 257/2 |
| 7,972,897 B2 * | 7/2011 | Kumar et al. | ................. | 438/104 |
| 7,977,153 B2 * | 7/2011 | Kumar et al. | ................. | 438/104 |
| 8,097,878 B2 * | 1/2012 | Kumar et al. | .................... | 257/43 |
| 8,129,704 B2 * | 3/2012 | Phatak et al. | ..................... | 257/2 |
| 8,143,092 B2 * | 3/2012 | Kumar et al. | ................. | 438/104 |
| 8,144,498 B2 * | 3/2012 | Kumar et al. | ................. | 365/148 |
| 8,227,787 B2 * | 7/2012 | Kumar et al. | ..................... | 257/2 |
| 8,294,219 B2 * | 10/2012 | Malhotra et al. | ............... | 257/382 |
| 8,344,375 B2 * | 1/2013 | Kumar et al. | .................... | 257/43 |
| 8,476,107 B2 * | 7/2013 | Kumar et al. | ................. | 438/104 |
| 2008/0185567 A1 * | 8/2008 | Kumar et al. | ..................... | 257/2 |
| 2008/0185572 A1 * | 8/2008 | Chiang et al. | ..................... | 257/4 |
| 2008/0185573 A1 * | 8/2008 | Sun et al. | ............................ | 257/4 |
| 2008/0219039 A1 * | 9/2008 | Kumar et al. | ................. | 365/148 |
| 2008/0220601 A1 * | 9/2008 | Kumar et al. | ................. | 438/585 |

(Continued)

FOREIGN PATENT DOCUMENTS

WO WO 2008097742 A1 * 8/2008 ............. H01L 45/00

*Primary Examiner* — Laura Menz

(57) ABSTRACT

Resistive switching memory elements are provided that may contain electroless metal electrodes and metal oxides formed from electroless metal. The resistive switching memory elements may exhibit bistability and may be used in high-density multi-layer memory integrated circuits. Electroless conductive materials such as nickel-based materials may be selectively deposited on a conductor on a silicon wafer or other suitable substrate. The electroless conductive materials can be oxidized to form a metal oxide for a resistive switching memory element. Multiple layers of conductive materials can be deposited each of which has a different oxidation rate. The differential oxidization rates of the conductive layers can be exploited to ensure that metal oxide layers of desired thicknesses are formed during fabrication.

20 Claims, 11 Drawing Sheets

(56) References Cited

U.S. PATENT DOCUMENTS

| | | | |
|---|---|---|---|
| 2008/0278990 A1* | 11/2008 | Kumar et al. | 365/148 |
| 2009/0227067 A1* | 9/2009 | Kumar et al. | 438/104 |
| 2009/0272959 A1* | 11/2009 | Phatak et al. | 257/2 |
| 2011/0081748 A1* | 4/2011 | Kumar et al. | 438/104 |
| 2011/0201149 A1* | 8/2011 | Kumar et al. | 438/104 |
| 2012/0074376 A1* | 3/2012 | Kumar et al. | 257/4 |
| 2012/0088328 A1* | 4/2012 | Phatak et al. | 438/104 |
| 2012/0142143 A1* | 6/2012 | Kumar et al. | 438/104 |
| 2012/0149164 A1* | 6/2012 | Kumar et al. | 438/382 |
| 2012/0319070 A1* | 12/2012 | Kumar et al. | 257/4 |
| 2013/0034947 A1* | 2/2013 | Hong et al. | 438/384 |
| 2013/0260508 A1* | 10/2013 | Kumar et al. | 438/104 |

* cited by examiner

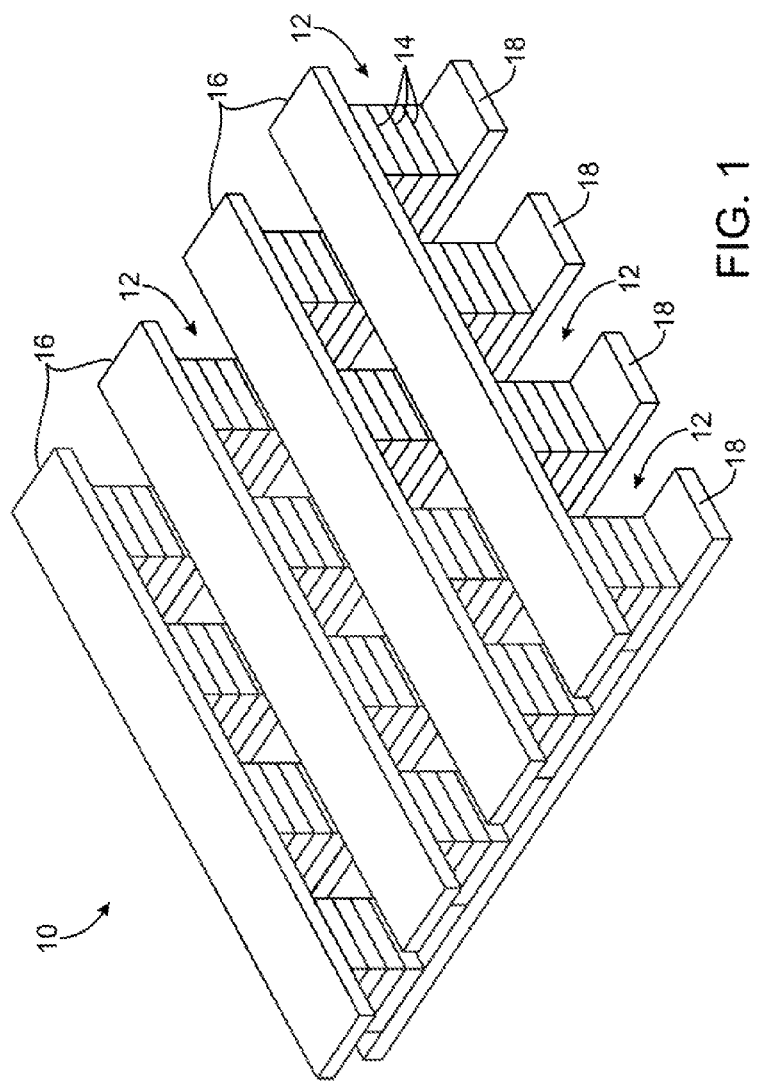

METHODS FOR FORMING RESISTIVE SWITCHING MEMORY ELEMENTS

CROSS-REFERENCE TO RELATED APPLICATIONS

This application is a divisional and claims priority to U.S. patent application Ser. No. 13/096,719, filed 28 Apr. 2011, which is itself a divisional claiming priority to U.S. patent application Ser. No. 11/702,966, filed 5 Feb. 2007 (issued 5 Jul. 2011 as U.S. Pat. No. 7,972,897). Both are entirely incorporated by reference herein for all purposes.

BACKGROUND

This invention relates to nonvolatile memory elements, and more particularly, to methods for forming nonvolatile resistive switching memory elements.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has lead to the investigation of alternative nonvolatile memory technologies, including resistive switching nonvolatile memory.

Resistive switching nonvolatile memory is formed using memory elements that have two or more stable states with different resistivities (i.e., resistances). Bistable memory has two stable states. A bistable memory element can be placed in a high resistance state or a low resistance state by application of suitable voltages or currents. Typically, voltage pulses are used to switch the memory element from one resistance state to the other. Nondestructive read operations can be performed to ascertain the value of a data bit that is stored in a memory cell.

Nonvolatile memory elements can be formed using metal oxides. Resistive switching based on nickel oxide switching elements and noble metal electrodes such as Pt has been demonstrated.

In a typical scenario, a stack of resistive switching oxide and electrode layers is deposited using physical vapor deposition (PVD) (sputtering). Dry etching is then used to pattern the deposited layers. However, materials such as transition metal oxides (especially, for example, nickel oxide) and platinum are difficult to etch (e.g. with dry chemical etching traditionally used to pattern thin films). Sputter etching (i.e., a non-reactive physical dry etch) can be used, but can i) damage the substrate and the films thereon, ii) create particles, iii) contaminate the etch tool itself, and iv) does not provide desirable patterned profiles. It would therefore be desirable to provide a process integration scheme that avoids or reduces the need for dry etching of the resistive switching memory element.

The working mechanism and the reliability of resistive switching memory based on transition metal oxides such as NiO have been shown to be dictated by the oxide composition (e.g., Ni to O ratio) and the oxide film micro-structure. However, it is difficult to precisely control the chemical composition (e.g., nickel oxidization state control, chemical doping, and alloying) and the microstructure of resistive switching elements such as elements formed from nickel-based oxide using PVD.

It would therefore be desirable to provide improved techniques for forming metal oxide resistive switching memory elements.

SUMMARY

In accordance with the present invention, integrated circuit resistive switching memory elements and methods of fabrication are provided.

An integrated circuit resistive switching memory element may be formed as part of an integrated circuit that contains multiple layers of resistive switching memory elements. An electrical component such as a diode or transistor may be placed in series with the resistive switching memory element.

A resistive switching memory element may have a metal oxide layer. Electrical contact may be made to the metal oxide layer using lower and upper layers of conductive material (e.g., a transition metal). The lower layer of conductive material (bottom electrode) may be formed on an underlying conductor using a selective electroless deposition process that deposits conductive material only on the conductor and not on surrounding insulating layers. The conductive material may be oxidized. By using selective electroless deposition techniques, the need to perform difficult oxide etching steps (e.g., nickel oxide dry etching steps) during subsequent processing may be avoided.

The conductor on which the lower layer of conductive material is formed may be a metal, a refractory metal, a refractory metal nitride, a refractory metal silicon nitride, a metal silicide, other suitable conductive materials, or combinations of such materials. If desired, the lower layer of conductive material may be formed from i) electroless nickel, ii) an electroless conductive material that contains nickel and boron, or iii) nickel and phosphorus.

The metal oxide layer may be formed by oxidizing at least a portion of the lower layer of conductive material. For example, if the lower layer of conductive material is formed from electroless conductive material, the top portion of the electroless conductive material can be oxidized to form the metal oxide layer and the bottom portion of the electroless conductive material can be left in its unoxidized state to serve as a lower electrode for the resistive switching memory element. The upper layer of conductive material can be formed by depositing nickel or other suitable conductors on the metal oxide layer with PVD or other suitable techniques.

If desired, the lower layer of conductive material can be formed from two or more layers of material that have potentially different compositions and that have been formed using potentially different fabrication techniques. By selection of appropriate material compositions and fabrication techniques, two layers can be deposited that have different oxidation rates. During oxidation to form the metal oxide layer, the differential oxidation rates of the two parts of the lower layer of conductive material can be exploited to ensure that the metal oxide layer has a desired thickness.

Further features of the invention, its nature and various advantages will be more apparent from the accompanying drawings and the following detailed description.

BRIEF DESCRIPTION OF THE DRAWINGS

FIG. 1 is a diagram of an illustrative array of resistive switching memory elements in accordance with an embodiment of the present invention.

DETAILED DESCRIPTION

Figure 2A:
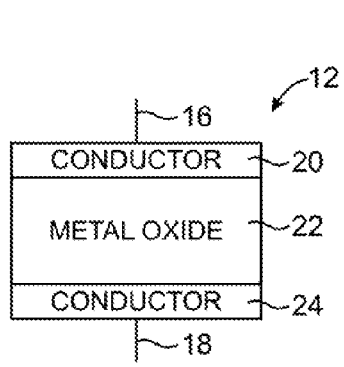
FIG. 2A is a cross-sectional view of an illustrative resistive switching nonvolatile memory element in accordance with an embodiment of the present invention.

Embodiments of the present invention relate to nonvolatile memory formed from resistive switching elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

An illustrative memory array 10 of resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory element 12 may be formed from one or more layers of materials, as indicated schematically by lines 14 in FIG. 1. In addition, the memory arrays shown can be stacked in a vertical fashion to make multi-layer 3-D memory arrays.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

A cross-section of an illustrative embodiment of a resistive switching memory element is shown in FIG. 2A. In the example of FIG. 2A, memory element 12 (as shown in FIG. 1) is formed from a metal oxide 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from any suitable metals (e.g., tungsten, aluminum, copper, metal silicides, etc.). Conductive lines 16 and 18 may also be formed from other conductive materials (e.g., doped polysilicon, doped silicon, etc.), combinations of these materials, or any other suitable conductive material. If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., diodes, p-i-n diodes, silicon diodes, silicon p-i-n diodes, transistors, etc.) that are formed between line 16 and electrode 20 or between line 18 and electrode 24.

Figure 2B:
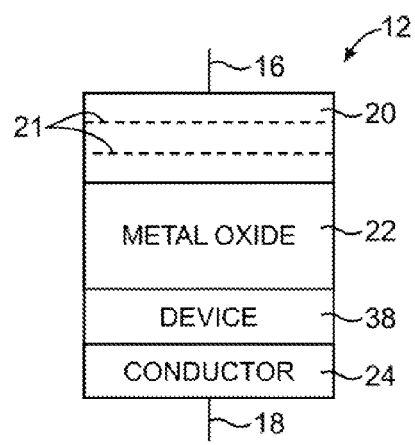
FIG. 2B is a cross-sectional view of an illustrative resistive switching nonvolatile memory element in accordance with another embodiment of the present invention.

If desired, there may be an intervening electrical component between an electrode and resistive switching metal oxide 22. An illustrative arrangement in which there is an intervening electrical component 38 between electrode 24 and metal oxide 22 is shown in FIG. 2B.

As indicated schematically by dotted lines 21, conductive materials such as electrodes 24 and 20 may be formed from one or more layers of materials. Examples of materials that may be used to form electrodes 20 and 24 include metal (e.g., refractory or transition metals), metal alloys, metal nitrides (e.g., refractory metal nitrides), metal silicon nitrides (i.e., materials containing refractory metals, transition metals, or other metals, along with silicon, and nitrogen), metal silicides, or other conductors.

With one illustrative embodiment, metal oxide 22 may be formed from a metal oxide such as a transition metal oxide (e.g., nickel-based oxide) and electrodes 20 and 24 may be formed from nickel or alloys of nickel. In this type of situation, a titanium nitride layer under lower electrode 24 may prevent nickel and other doping and alloying elements in a nickel-based oxide from diffusing into an underlying silicon structure.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry 14 (FIG. 1) may apply suitable control signals across terminals 16 and 18.

Figure 3:
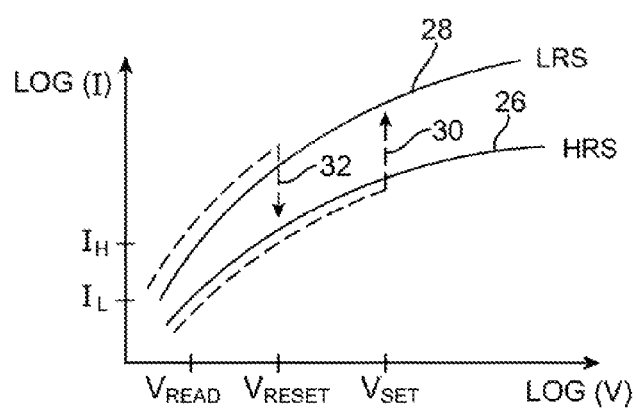
FIG. 3 is a graph showing how a resistive switching nonvolatile memory element of the types shown in FIGS. 2A and 2B may exhibit bistable behavior in accordance with an embodiment of the present invention.

A current (I) versus voltage (V) plot for device 12 is shown in FIG. 3. Initially, device 12 may be in a high resistance state (e.g., storing a logic one). In this state, the current versus voltage characteristic of device 12 is represented by solid line HRS 26. The high resistance state of device 12 can be sensed by read and write circuitry 14 (FIG. 1). For example, read and write circuitry 14 may apply a read voltage $V_{READ}$ to device 12 and can sense the resulting low current $I_L$ that flows through device 12. When it is desired to store a logic zero in device 12, device 12 can be placed into its low-resistance state. This may be accomplished by using read and write circuitry 14 to apply a voltage $V_{SET}$ across terminals 16 and 18 of device 12. Applying $V_{SET}$ to device 12 causes device 12 to enter its low resistance state, as indicated by dotted line 30. In this region, the structure of device 12 is changed (e.g., through the formation of current filaments through metal oxide 22 or other suitable mechanisms), so that, following removal of the voltage $V_{SET}$, device 12 is characterized by low resistance curve LRS 28.

The low resistance state of device 12 can be sensed using read and write circuitry 14. When a read voltage $V_{READ}$ is applied to resistive switching memory element 12, read and write circuitry 14 will sense the relatively high current value $I_H$, indicating that device 12 is in its low resistance state. When it is desired to store a logic one in device 12, device can once again be placed in its high resistance state by applying a voltage $V_{RESET}$ to device 12. When read and write circuitry 14 applies $V_{RESET}$ to device 12, device 12 enters its high resistance state HRS, as indicated by dotted line 32. When the voltage $V_{RESET}$ is removed from device 12, device 12 will once again be characterized by high resistance line HRS 26.

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is nonvolatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12. This is merely illustrative. If desired, other electrical devices may be associated with each element 12.

Figure 4:
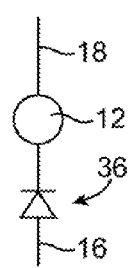
FIG. 4 is a schematic diagram of an illustrative resistive switching memory element in series with a diode in accordance with an embodiment of the present invention.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
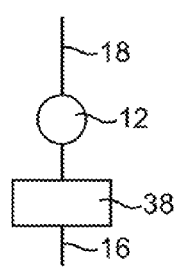
FIG. 5 is a schematic diagram of an illustrative resistive switching memory element in series with an electrical device in accordance with an embodiment of the present invention.
Figure 6:
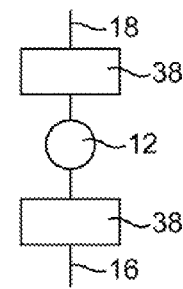
FIG. 6 is a schematic diagram of an illustrative resistive switching memory element in series with two electrical devices in accordance with an embodiment of the present invention.

If desired, other electrical components can be formed in series with resistive switching memory element 12. As shown in FIG. 5, electrical device 38 may be placed in series with resistive switching memory element 12. Device 38 may be a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12.

Memory elements 12 may be formed in a single layer in array 10 or may be formed in multiple layers. An advantage of forming memory arrays such as memory array 10 of FIG. 1 using a multi-layer memory element scheme is that this type of approach allows memory element density to be maximized.

If desired, a resistive switching metal oxide layer may be formed above or below a diode (as an example). Conductive lines 16 and 18 may be electrically coupled to metal oxide 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in element 12 may be formed from the same conductive material or different conductive materials. For example, conductive layers in element 12 may include two nickel layers or may contain a nickel layer and a titanium nitride layer (as an example). Moreover, conductive layers in element 12 may be formed using the same techniques or different techniques. As an example, one layer of nickel may be formed using physical vapor deposition (PVD) techniques (e.g., sputter deposition), whereas another layer of nickel may be formed using electrochemical deposition.

The portions of the conductive layers in element 12 that are immediately adjacent to metal oxide 22 or are otherwise in close association with metal oxide 22 are sometimes referred to as the electrodes of the resistive switching memory element 12.

In general, the electrodes of resistive switching memory element 12 may each include a single material (e.g., nickel), may each include multiple materials (e.g., nickel and titanium nitride), may include materials formed using different techniques (e.g., electrochemically deposited nickel and PVD nickel), or may include combinations of such materials.

Certain metals are particularly appropriate for forming metal oxide 22. These metals may include, for example, the transition metals and their alloys. With one particularly suitable arrangement, the metals for forming metal oxide 22 include nickel. The metal oxide 22 may include other elements in addition to nickel. For example, metal oxide 22 may include nickel and boron, may include nickel and phosphorus, may include nickel and cobalt, may include nickel and titanium, may include nickel and tungsten, etc. Metals other than nickel, such as titanium, may also be used for metal oxide 22. Nickel-based metal oxides 22 are sometimes described herein as an example.

Any suitable conductive materials may be used for forming the electrodes 20 and 24 of resistive switching memory element 12. Illustrative conductive materials include transition metals (and their nitrides), refractory metals (and their nitrides), and noble metals. Illustrative examples of conductive materials include Ti, Ta, W, Mo, Hf, Nb, Ni, Pd, Pt, Re, Ru, and IR. Illustrative metal nitrides include titanium nitride, tantalum nitride, tungsten nitride, and molybdenum nitride. High workfunction materials such as Ni, Pt, and Ir are preferred as they facilitate the formation of ohmic contacts to nickel-based oxides, a typically p-type material. These are merely illustrative examples of materials that may be used for electrodes 20 and 24. Combinations of two or more of these materials (and/or their nitrides) metals may be used or other suitable conductive materials may be used as electrodes 20 and 24, if desired.

The electrodes 20 and 24 and other conductive layers that may be associated with elements 12 may be formed using any suitable techniques. Illustrative conductive material fabrication techniques include physical vapor deposition (e.g., sputter deposition, evaporation), chemical vapor deposition, atomic layer deposition, and electrochemical deposition (e.g., electroless deposition, electroplating). Metal oxide 22 may be formed by oxidizing one or more of these conductive materials. Conductive materials with different compositions and materials that have been formed using different fabrication techniques may exhibit significantly different oxidation rates. If desired, differential oxidation rates can be exploited to help form metal oxides 22 of desired thicknesses. For example, a readily oxidized material can be completely oxidized while a layer of less-readily oxidized material will remain unoxidized or only slightly oxidized. When it is desired to form a metal oxide 22 directly on a particular electrode metal, part of the electrode metal can be oxidized. The part of the electrode metal that is not oxidized in this way can then serve as the electrode.

Nickel-containing conductive materials may be advantageous for forming metal oxide 22 and for forming electrodes 20 and 24. For example, nickel electrodes may be suitable for forming ohmic contacts on nickel oxide 22. Techniques for forming resistive switching memory elements 12 using nickel-based arrangements are therefore sometimes described herein as examples. Other materials systems may be used if desired. Such materials systems may produce different results. For example, when other electrodes are used, the electrodes may form Schottky diode contacts with the resistive switching metal oxide (which acts as a semiconductor) rather than ohmic contacts.

Figure 7:
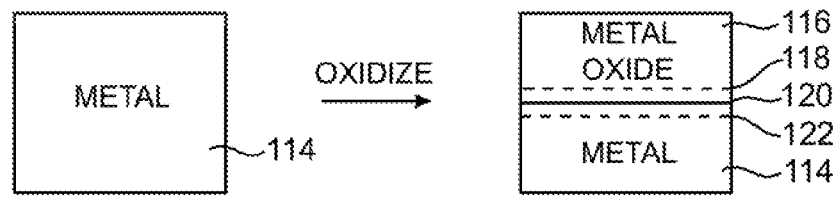
FIGS. 7, 8, and 9 are cross-sectional side views of an illustrative resistive switching memory element during fabrication in accordance with an embodiment of the present invention.

During fabrication of resistive switching memory element 12, it may be desirable to form a metal oxide 22 (FIG. 2) of a particular thickness. One arrangement for forming a metal oxide layer of a given thickness involves controlling the amount that an underlying metal layer is oxidized by selection of appropriate processing parameters. As shown in FIG. 7, metal 114 may be oxidized to form a metal oxide 116. Following oxidation, metal oxide 116 lies above an unoxidized portion of metal 114. Metal oxide 116 serves as the metal oxide 22 of resistive switching memory element 12 and metal 114 serves as the electrode 24 of resistive switching memory element 12. Metal 114 may be formed from a conductive material that contains one or more metals in one or more layers.

The thickness of metal oxide layer 116 is determined by the position of the boundary 120 between metal 114 and metal oxide 116. By controlling of the amount of oxidation performed on metal 114, the location of boundary 120 can be controlled. For example, when performing a rapid thermal oxidation of metal 114, the time, temperature profile, and oxygen gas concentration associated with the oxidation process can be controlled to adjust the position of boundary 120.

Particularly in integrated circuits in which there are multiple levels of devices, it can be challenging to control the location of boundary 120. Process variations and thermal cycling during the formation of additional circuit layers (e.g., additional layers of resistive switching memory elements) can make accurate oxidation difficult. If metal 114 is oxidized more than desired, the location of boundary 120 may be where indicated by dotted line 122. If metal 114 is oxidized less than desired, the location of boundary 120 may be where indicated by dotted line 118.

Figure 8:
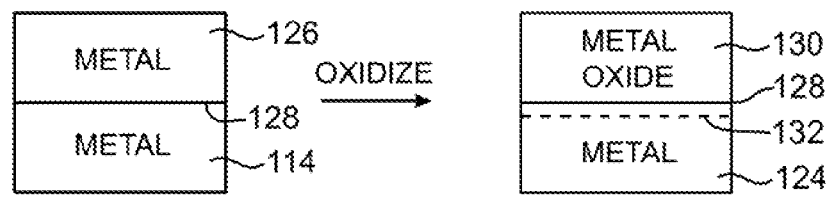

One way to enhance the accuracy of the position of boundary 120 involves exploiting the differential oxidation rates that are associated with different types of conductive materials. As shown in FIG. 8, two layers of conductive material (e.g., metal 124 and metal 126) can be deposited. Metals 124 and 126 may be formed using potentially different processes and may have potentially different compositions. These differences make metal 124 more resistant to oxidation than metal 126. The interface between metal 124 and metal 126 is shown by line 128. The amount of oxidation that is performed is adjusted so as to completely oxidize metal 126.

For example, if metal 126 is 1000 angstroms thick, the oxidization time, temperature, and oxygen gas pressure in a rapid thermal oxidation tool may be selected so as to completely oxidize all 1000 angstroms of metal 126. In addition, a small amount of extra oxidation may be performed (e.g., by extending the oxidation time by 10%). This additional buffer time ensures that all 1000 angstroms of metal 126 will be oxidized to form metal oxide 130 despite potential process variations.

In the situation in which none of metal layer 124 is oxidized and all of metal layer 126 has been oxidized to form metal oxide 130, the position of the boundary between metal oxide 130 and metal layer 124 is given by boundary line 128 on the right-hand side of FIG. 8. Due to the extra buffer of oxidization, some of metal 124 is oxidized. The boundary between the oxidized portion of metal 124 and the unoxidized portion of metal 124 is given by dotted line 132.

If metal 126 and 124 oxidize at the same rate, a 10% addition in the amount of oxidization that is performed would be expected to lead to a comparable error in the location of boundary 128. However, because metal 124 oxidizes more slowly than metal 126, the position of boundary 132 may be relatively close to the location given by line 128. If, as an example, metal 124 oxidizes ten times more slowly than metal 126, oxidization will effectively stop at the boundary 128 between metal 126 and 124, even in the presence of additional oxidization (e.g., an extra 10% buffer). In practice, a small amount of metal 124 will be oxidized, but this amount is generally negligible. The differential oxidization rates of metals 124 and 126 therefore allow the position of the boundary between metal oxide 130 and metal 124 to be accurately controlled. Metal oxide thickness accuracy in differential oxidization rates schemes such as these can be significantly enhanced relative to arrangements of the type shown in FIG. 7.

It is often desirable to not completely oxidize the lower conductor as the unoxidized portion can serve as the lower electrode. For example, in nickel-based systems, it is desirable to form nickel oxide on unoxidized nickel.

Figure 9:
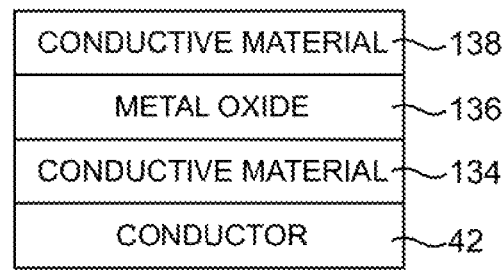

Metals such as metal 114 and metals 124 and 126 may be any suitable conductive materials (e.g., a nickel and phosphorus mixture, a nickel and boron mixture, nickel alloys, elemental metals, PVD metal, electroless metal, etc.). These metals may, if desired, be formed on a conductor 42, as shown by the placement of conductive material 134 on conductor 42 in FIG. 9. Following oxidization of conductive material 134 to form metal oxide 136, conductive material 138 (e.g., an upper nickel electrode) may be formed above conductor 42, conductive material 134, and metal oxide 136, as shown in FIG. 9.

Any suitable technique may be used to fabricate resistive switching memory elements in accordance with the present invention. An illustrative embodiment of a resistive switching memory element fabrication technique that uses electrochemical deposition methods is described in connection with FIGS. 10-19.

Resistive switching memory elements may be formed on any suitable substrate. With one particularly suitable arrangement, resistive switching memory elements are formed on a substrate formed from a wafer of crystalline silicon. Fabrication techniques that use silicon wafer substrates are described herein as an example. Suitable substrates that may be used include silicon-on-insulator substrates, substrates formed of non-silicon semiconductors, substrates having layers of polycrystalline materials, substrates formed of glass or other amorphous materials, etc.

Figure 10:
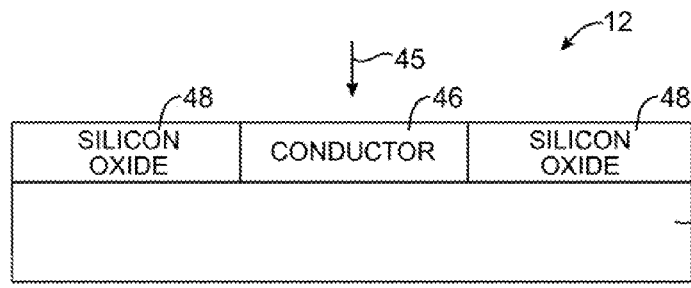
FIGS. 10, 11, 12, and 13 are cross-sectional side views of an illustrative resistive switching memory element during fabrication in accordance with an embodiment of the present invention.

FIG. 10 shows a cross-sectional view of a portion of an integrated circuit containing a partly formed resistive switching memory element 12. In the example of FIG. 10, resistive switching memory element 12 is being formed on a substrate 44 such as a silicon wafer. Substrate 44 may contain one or more layers of previously formed memory elements, transistors, and other electrical devices. These optional layers are shown schematically as substrate 44 in FIG. 10. Memory element 12 may have any suitable shape. With one suitable arrangement, memory element 12 has a square or rectangular surface area (when viewed from the top in direction 45). In another suitable arrangement, memory element 12 has a circular area (when viewed from the top in direction 45).

A conductor such as conductor 46 is formed on substrate 44. Conductor 46 may be made up of one or more layers of conductive material. The thickness of conductor 46 may be about 0.005-1.0 microns (as an example). Conductor 46 may be associated with a conductive line such as lines 16 and 18 of FIGS. 1, 2A, 2B, and 4-6 or any other suitable conductive structures. Examples of such conductive structures include interconnect lines, device contacts, diffusion barrier layers, adhesion layers, etc. The conductive material of conductor 46 may be a metal, a transition metal, a transition metal nitride, a transition metal silicon nitride, a refractory metal, a refractory metal nitride, a refractory metal silicon nitride, a metal silicide, doped silicon, doped polysilicon, other suitable conductive substances, or combinations of these materials.

Laterally adjacent insulating layer 48 may be used to isolate conductor 46 from other structures on the integrated circuit. Insulator 48 may be formed from silicon oxide (e.g., silicon dioxide), organo-silicates, low-k materials based on silicon oxide or based on other materials (e.g., $SiC_xN_yH_z$ or $SiC_xO_yH_z$, etc.), or other suitable dielectric materials (e.g., polymers, glass, etc.). The use of silicon oxide as a material for insulating regions 48 is sometimes described herein as an example.

Insulator 48 may surround conductor 46 on four sides when conductor 46 forms a column of conductive material. When conductor 46 forms a conductive line, insulator 48 may surround conductor 46 on the right and left (in the orientation shown in FIG. 10) or on three sides (i.e., in situations in which a line of conductor 46 terminates under resistive switching memory element 12).

Because conductor 46 is formed of a conductive material, electrochemical deposition techniques may be used to form subsequent conductive layers. In the example of FIGS. 10-19, nickel-containing conductive materials are grown using electroless deposition techniques. If desired, other conductive materials and techniques may be used to deposit the conductive materials for resistive switching memory element 12. Electroless nickel-based deposition techniques are described as an example.

During the fabrication process, metal oxides such as nickel oxide may be formed (e.g., for metal oxide layer 22 of FIGS. 2A and 2B). Metal oxides such as nickel oxide may be difficult to etch using conventional techniques (e.g., sputter etching). By using selective electroless deposition techniques, the need to perform difficult nickel oxide etching steps may be avoided.

During selective electroless deposition, conductive material is deposited selectively on the exposed upper surface of conductor 46, without depositing any significant amount of conductive material on exposed insulating regions such as the surfaces of silicon oxide 48. Although trace amounts of electrolessly deposited conductive material may be formed on silicon oxide 48 during electroless deposition, such trace amounts are generally negligible and do not adversely affect proper device operation. An electroless deposition technique in which substantially all of the electroless material is deposited on conductor 46 rather than on silicon oxide 48 is therefore generally considered to be a selective deposition technique in which no conductor is deposited on silicon oxide 48.

Figure 11:
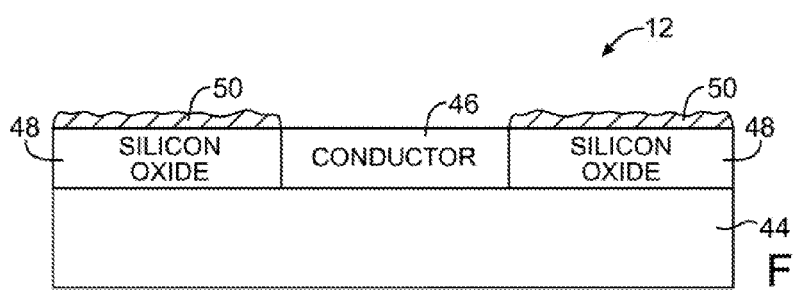

If desired, the surfaces of silicon oxide 48 may be coated with a layer of material that helps to prevent unwanted electroless deposition of conductive material on the insulating regions. This type of material layer, which is sometimes referred to as a molecular masking layer, may be formed on the surface of silicon oxide 48 prior to electroless deposition and may be removed from the surface of silicon oxide 48 following electroless deposition. As shown in FIG. 11, molecular masking layer 50 may be selectively deposited on silicon oxide 48, so that the surface of conductor 46 is not coated.

Figure 14:
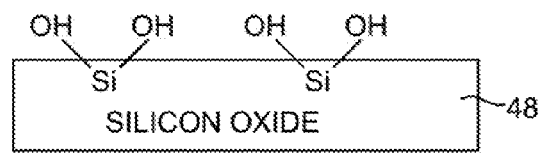
FIGS. 14, 15, and 16 are diagrams illustrating how a molecular masking layer may be used to help ensure that electrolessly deposited metal is selectively applied to conductive structures associated with a resistive switching memory element without being applied to insulating layers in accordance with an embodiment of the present invention.
Figure 15:
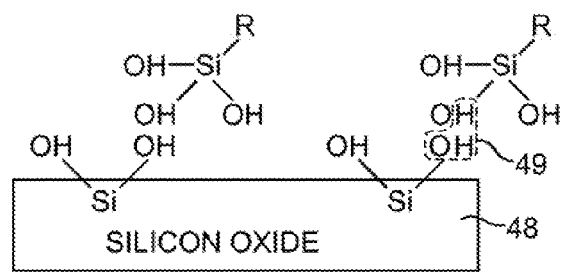
Figure 16:
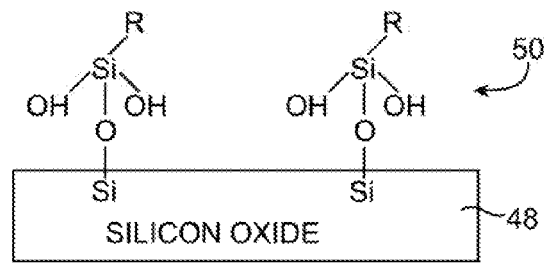

The operation of an illustrative molecular masking layer 50 is shown in FIGS. 14, 15, and 16. In the example of FIGS. 14, 15, and 16, the molecular masking layer is formed from a solution of $H_3C(OCH_2)_6Si(OC_2H_5)_3$ in water at a concentration of about 5 mM to 100 mM. Initially, silicon oxide layer 48 is covered with some Si—OH functional groups, as shown in FIG. 14. In the presence of $H_3C(OCH_2)_6Si(OC_2H_5)_3$ (diagrammed as $RSi(OH_3)$ in FIG. 15), an Si—OH functional group from the molecular masking layer solution has reacted with an Si—OH molecule from the surface of silicon oxide 48. As shown by dotted line 49, two hydrogen atoms and an oxygen atom ($H_2O$) are removed through a condensation reaction, which leaves masking layer 50 as shown in FIG. 16.

Figure 12:
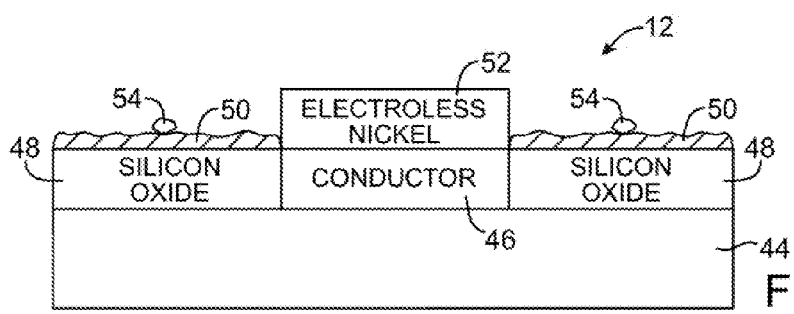

As shown in FIG. 12, once masking layer 50 has been deposited, electroless conductive material 52 can be selectively deposited on conductor 46. Conductive material 52 can be deposited to any suitable thickness (e.g., 0.005-1.0 microns). In FIG. 12 and the other FIGS., conductive material 52 is labeled "electroless nickel." Electroless nickel material 52 can contain elements other than nickel (e.g., boron, phosphorus, etc.), but is labeled as "electroless nickel" to avoid over-complicating the drawings. Electroless conductive material 52 may be based on metals other than nickel, but nickel-based electroless conductive material layers 46 are described herein as an example.

Figure 13:
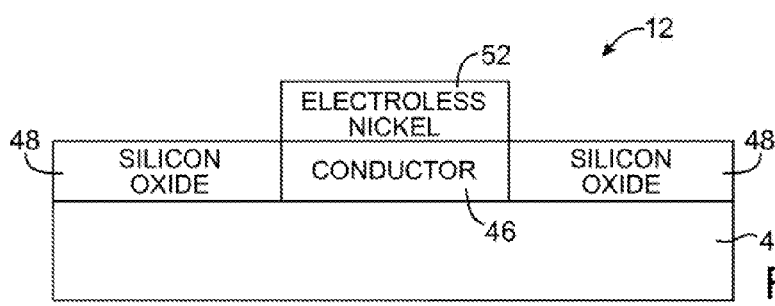

Electroless conductive material 52 is selectively deposited on conductor 46 without depositing on silicon oxide 48. With a typical arrangement, the thickness of layer 52 is about 0.01 to 1 microns. One or more different conductive materials may be formed in layer 52 using one or more suitable deposition techniques. If any traces 54 of conductive material are deposited on silicon oxide 48 during deposition of layer 52, they can be readily removed by removing molecular masking layer 50 (FIG. 13). Molecular masking layer 50 may be removed using any suitable removal process. For example, molecular masking layer 50 may be removed by rinsing the substrate 44 in deionized water. As another example, molecular masking layer 50 may be removed by treating substrate 44 with a cleaning solution. Cleaning solutions that may be used include those designed for various wafer cleaning processes such as post chemical mechanical polishing (CMP) clean or preclean processes used for different applications.

Following cleaning, a metal oxide layer for the resistive switching memory element is formed on electroless nickel layer 52. Any suitable technique may be used for forming the metal oxide layer. With one suitable approach, the conductive material in layer 52 is oxidized to form the metal oxide. Oxidation may be performed using thermal oxidation (e.g., rapid thermal oxidation—RTO, thermal oxidation in a furnace, laser-induced thermal oxidation, etc.), plasma oxidation, or oxidation by ion implantation of oxygen ions. The oxidation process can be performed in a vacuum, in an environment at atmospheric pressure, or in an environment above atmospheric pressure (i.e., a supra-atmospheric environment). An advantage of forming the metal oxide layer for the resistive switching memory element by oxidizing metal that has been deposited is that the metal oxide may be formed only where metal is present. Because this type of approach avoids blanket deposition of metal oxide, no steps are necessary to pattern the metal oxide once it has been formed.

Figure 17:
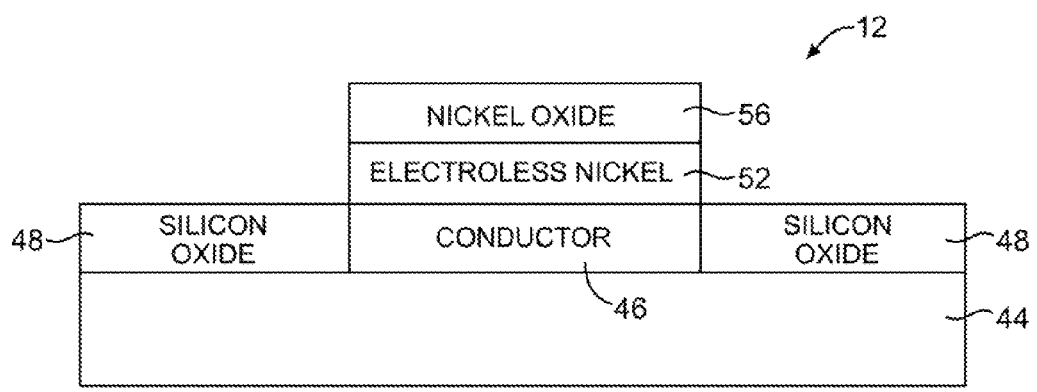
FIGS. 17, 18, and 19 are additional cross-sectional side views of the illustrative resistive switching memory element being formed in FIGS. 11-14 during subsequent fabrication operations in accordance with an embodiment of the present invention.

FIG. 17 shows the electroless conductive material layer 52 following oxidation. As shown in FIG. 17, the upper portion of electroless nickel layer 52 is oxidized to form oxide layer 56. Oxide layer 56 may contain nickel and other elements (e.g., boron, phosphorus, etc.). Oxide layer 56 is labeled "nickel oxide" in FIG. 17 to avoid over-complicating the drawings. Oxide layer 56 may be about 0.01 to 1.0 microns in thickness. More preferably, the oxide layer 56 is about 20 angstroms to about 1000 angstroms thick. In another embodiment, the entire electroless nickel layer 52 deposited on the conductor 46 is converted to oxide layer 56.

Following metal oxide formation, an upper conductive layer (e.g., the upper or top electrode) may be formed. The upper conductive layer may be formed using, for example, physical vapor deposition (PVD), chemical vapor deposition (CVD), atomic layer deposition (ALD), electroless deposition, electroplating, etc. Other deposition approaches may also be used. One suitable approach is illustrated in FIGS. 18 and 19.

Figure 18:
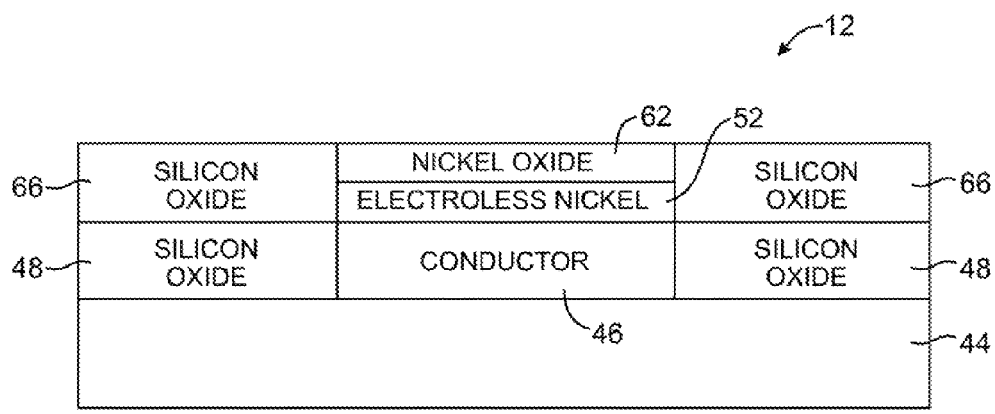
Figure 19:
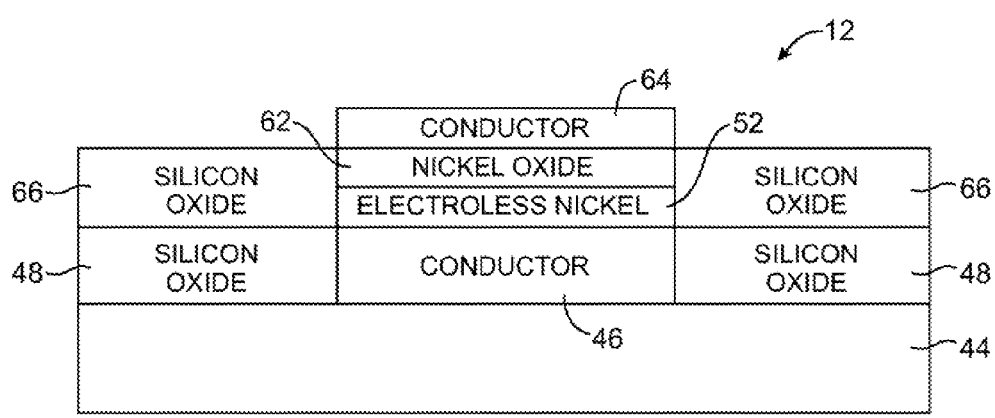

FIGS. 18 and 19 are cross-sectional views that illustrate how an upper electrode may be formed using a PVD-based technique.

As shown in FIG. 18, following nickel oxide formation (FIG. 17), silicon oxide layer 66 may be deposited and planarized (e.g., using plasma or non-plasma-based chemical vapor deposition and subsequent CMP polishing techniques).

A blanket layer of conductor (e.g., metal or doped poly-Si) may then be deposited and photolithographically patterned to form conductor 64 of FIG. 19. The conductor may be deposited using PVD or other suitable techniques and may be patterned using wet or dry etching or other suitable techniques. Conductor 64 may be formed from nickel or other metals, combinations of these metals, or other conductive materials.

Figure 20:
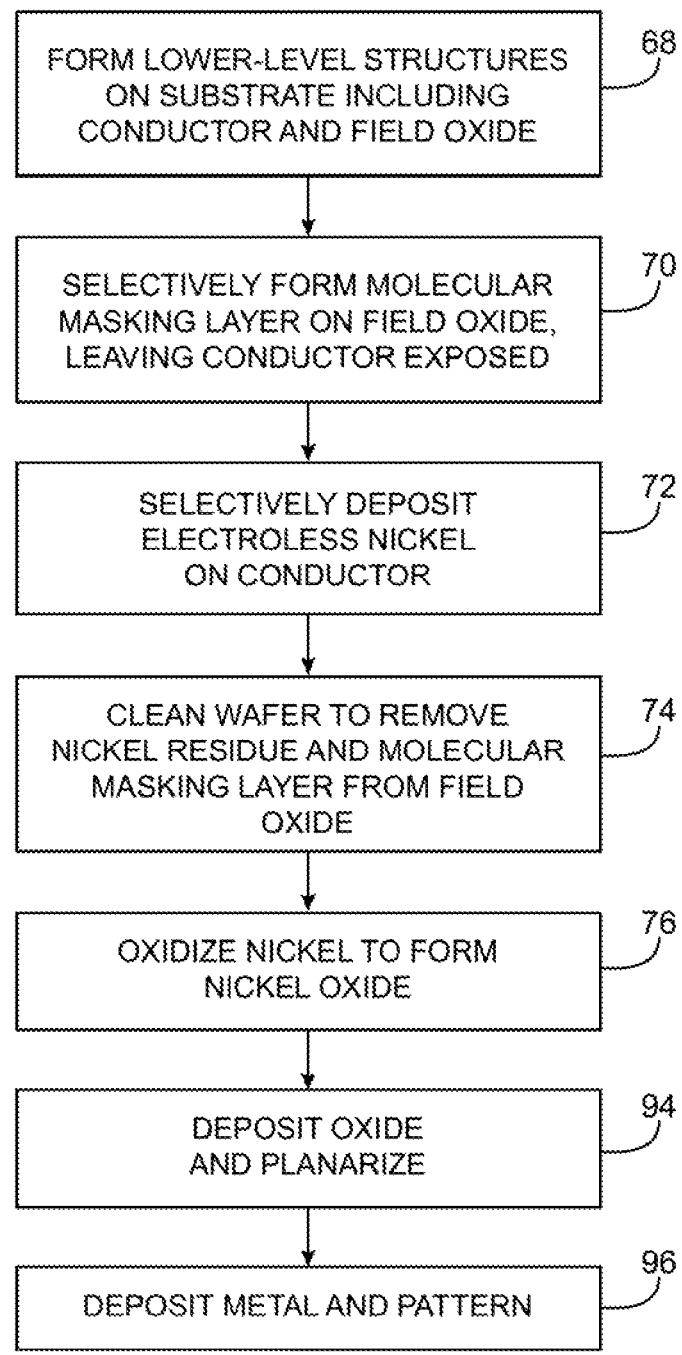
FIG. 20 is a flow chart of illustrative steps involved in fabricating a resistive switching memory element of the type shown in FIGS. 17, 18, and 19 in accordance with an embodiment of the present invention.

Illustrative steps involved in forming a resistive switching memory element of the type described in connection with FIGS. 10-19 are shown in the flow chart of FIG. 20.

At step 68, lower-level structures such as conductor 46 and silicon oxide 48 of FIG. 10 may be formed on substrate 44. Conductor 46 may form part of an interconnect line such as lines 16 and 18 of FIG. 1, may form part of an electrode for the resistive switching memory element 12, or may be any other suitable conductive material layer. Conductor 46 may be formed (as an example) by PVD techniques. Conductor 46 and silicon oxide 48 may, if desired, be planarized using CMP techniques.

At step 70, an optional molecular masking layer such as molecular masking layer 50 of FIG. 11 may be selectively formed on silicon oxide 48 without coating the exposed surface of conductor 46.

At step 72, electroless nickel may be selectively deposited on conductor 46 without depositing nickel on silicon oxide 48 (i.e., without depositing more than trace amounts of electroless nickel on oxide 48), as shown in FIG. 12. Because nickel 52 is formed selectively on conductor 46, nickel 52 (which may serve as all or part of a lower electrode for memory element 12), need not be patterned during subsequent processing steps.

Any suitable electroless chemistry may be used in forming electroless layers such as electroless nickel layer 52 of FIG. 12. With one suitable arrangement, substrate 44 is placed in a water bath containing nickel sulfate ($NiSO_4$) at a concentration of 0.015 M to 0.15M. In addition to the nickel sulfate reactant, the electroless solution includes a reducing agent such as ammonium hypophosphite ($NH_4H_2PO_2$) at concentrations of up to about 0.15 M. The ammonium hypophosphite supplies phosphorus to the deposited layer of electroless conductive material and acts as a reducing agent for deposition of nickel. In a typical scenario, the phosphorus concentration in the deposited layer is approximately 1-10%.

This electroless nickel deposition technique is merely illustrative. Other nickel-based conductive materials can be electrolessly deposited (e.g., conductive materials containing boron and nickel) and other nickel-based electroless deposition chemicals may be used.

Following selective deposition of electroless nickel 52, substrate 44 may be cleaned to remove molecular masking layer 50 and any nickel residue that may be present (step 74).

At step 76, electroless nickel 62 may be oxidized to form nickel oxide 56, as shown in FIG. 17. With one suitable arrangement, electroless nickel 52 is oxidized by rapid thermal oxidation in an oxygen gas environment. The oxidized electroless nickel forms metal oxide layer 22 of FIGS. 2A and 2B. The remaining electroless nickel 62 (and any associated underlying conductive materials) form lower electrode 24 of memory element 12.

At step 94, silicon oxide may be deposited and planarized, producing planarized silicon oxide layer 66 and exposed nickel oxide 62 of FIG. 18.

At step 96, patterned metal or other conductive material may be formed on the surface of the wafer. For example, PVD may be used to form a blanket layer of nickel. Photolithography and wet or dry etching may then be used to pattern the deposited conductive material to form conductor 64 of FIG. 19.

The operations described in connection with FIGS. 10-19 involve forming an upper electrode for resistive switching memory element 12 using physical vapor deposition. If desired, the upper conductive metals for forming memory element 12 may be formed using other techniques, such as electroless deposition. With an electroless deposition process, a thin seed layer may be patterned on top of regions of patterned nickel oxide 56 prior to electroless deposition.

Figure 21:
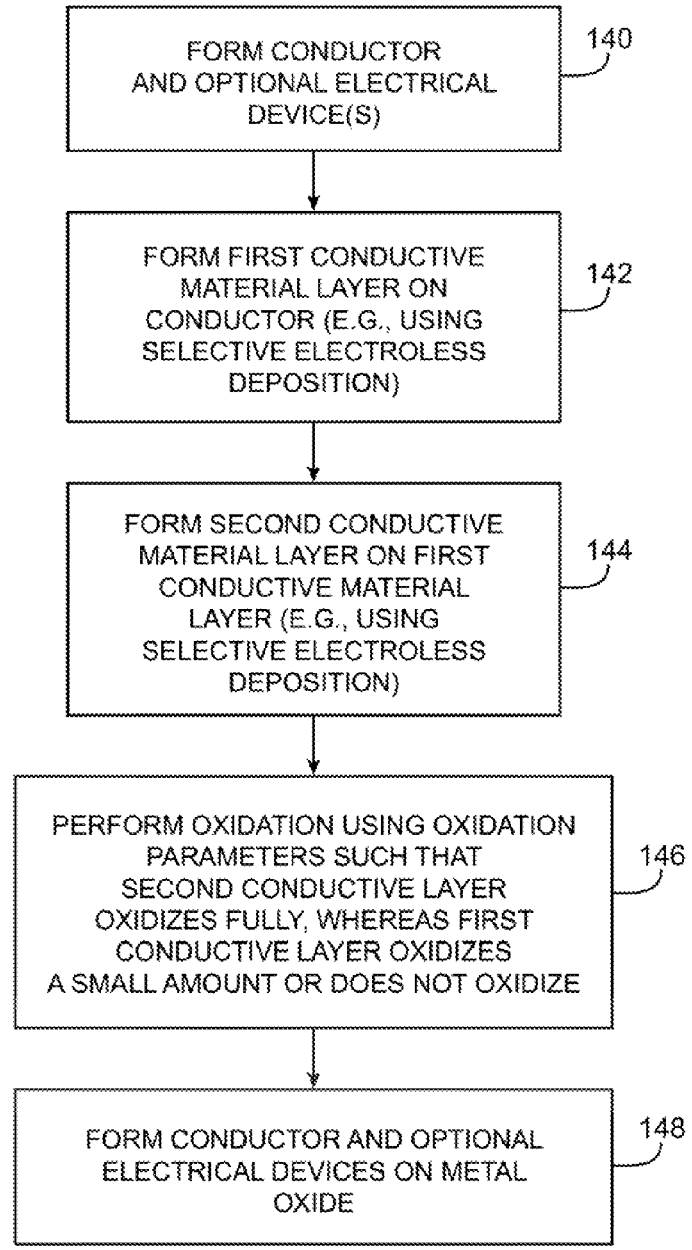
FIG. 21 is a flow chart of illustrative steps involved in forming a resistive switching memory element and associated optional electrical devices using a differential oxidation scheme in accordance with an embodiment of the present invention.

Illustrative steps involved in forming a resistive switching memory element using a differential oxidization rate scheme of the type shown in FIG. 8 are shown in FIG. 21.

At step 140, a conductor such as conductor 42 of FIG. 9 and optional electrical devices 38 such as diode 36 (FIGS. 4, 5, and 6) may be formed on a silicon wafer or other suitable substrate. Conductor 42 may be part of a line such as line 16 or 18 of FIG. 1 or other interconnect structure, may be part of an optional electrical device 38, may be a diffusion barrier, may be an adhesion layer, or may be any other suitable conductive layer.

At step 142, a first layer of conductive material such as conductive material 134 of FIG. 9 is formed on conductor 42.

At step 144, a second layer of conductive material is formed on the first layer of conductive material. The second layer of conductive material is selected so that it oxidizes more readily than the first layer of conductive material. In general, any suitable ratio of oxidization rates may be chosen. For example, the ratio of the oxidation rate for the more readily oxidized material to the oxidation rate for the less readily oxidized material may be 2:1, more than 2:1, 5:1, more than 5:1, 10:1, more than 10:1, 100:1, more than 100:1, etc.

Deposition techniques that may be used to form the first and second conductive layers include physical vapor deposition (PVD), chemical vapor deposition (CVD), atomic layer deposition (ALD), and electrochemical deposition (e.g., electroless deposition or electroplating, etc.). The type of deposition technique that is used in forming a conductive material can affect the oxidization rate of that material. For example, PVD nickel oxidizes less readily than electroless nickel. This effect can be used to produce the first and second conductive layers (i.e., the first conductive layer may be formed from PVD nickel and the second conductive layer may be formed from electroless nickel). Moreover, the composition of a conductive material affects its oxidization rate. For example, electroless nickel containing 1-10% boron oxidizes less readily than electroless nickel containing 1-10% phosphorus. Material composition may therefore also be used to ensure that the oxidation rates of the first and second layers of conductive material are different.

If desired, a combination of deposition technique selection and material composition selection may be used to ensure that the first and second conductive materials have appropriately different oxidization rates. Electroless nickel containing boron will generally oxidize less readily than PVD nickel. PVD nickel containing chromium will generally oxidize less readily than PVD nickel. PVD nickel will generally oxidize less readily than electroless nickel containing phosphorus. Electroless nickel containing phosphorus will generally oxidize less readily than electroless nickel. Electroless nickel layers typically contain boron, phosphorus, both boron and phosphorus, or other materials. The relative oxidation rates of such layers of different compositions can be measured empirically and used to form suitable arrangements in which their differential oxidation rates are exploited.

After forming the second layer of conductive material at step 144, the first and second layers of conductive material are subjected to an oxidizing environment. For example, the silicon wafer is placed in a rapid thermal oxidation (RTO) tool or a thermal oxidization furnace. Oxidation may also be performed using laser-induced thermal oxidation, plasma oxidation, or oxidation by ion implantation of oxygen ions. The oxidation process can be performed in a vacuum environment, an atmospheric environment, or a supra-atmospheric environment. The oxidation process oxidizes at least the second layer of conductive material. Due to the differential oxidization rate between the first and second layers of conductive material, the second layer of conductive material will generally oxidize completely and oxidization will effectively stop at the boundary between the first and second layers of conductive material.

Depending on the amount of extra buffer oxidation that is expected due to selection of the oxidization parameters (e.g., time, temperature, gas pressure, etc.), the first layer of conductive material may be oxidized by either a negligible amount or by a relatively small amount compared to the second layer. For example, the thickness of the oxidation layer in the first layer of conductive material may be one tenth of the thickness of the oxidized second layer, may be less than one tenth of the oxidized second layer thickness, may be one hundredth of the oxidized second layer thickness or less, etc.

In scenarios in which oxidization parameters are selected so that differential oxidization rates between the first and second material layers are not exploited, the second layer may oxidize incompletely and the first layer may not oxidize or the second layer may oxidize fully while the first layer oxidizes a substantial amount or is fully oxidized.

The operations of step 146 oxidize some or all of the deposited conductive material layers and produce the metal oxide layer 22 (FIGS. 2A and 2B). The unoxidized metal layers (e.g., the substantially unoxidized first layer) form the lower electrode. Other materials (e.g., conductor 42 of FIG. 9) may also be associated with or form part of the lower electrode.

At step 148, additional processing steps are performed to complete the fabrication of resistive switching memory element 12. In particular, one or more additional conductive material layers and optional electrical devices 38 such as diodes 36 may be formed above the metal oxide layer. The conductive material layers may include, as an example, nickel-based metal layers that are formed on the metal oxide and that serve as an upper electrode for the resistive switching memory element 12. Additional conductive materials (e.g., portions of lines such as lines 16 and 18 of FIG. 1 or portions of diodes and other electrical devices) may also be formed.

In some integrated circuit environments, conductors such as conductor 42 of FIG. 9 may be formed from transition metal nitrides or refractory metal nitrides (e.g., titanium nitride, tungsten nitride, molybdenum nitride, and tantalum nitride) or other materials such as refractory metals, metal nitrides other than transition metal nitrides, metal silicon nitrides (e.g., a conductive material formed of metal, silicon, and nitrogen), metal silicides, doped silicon, or doped polysilicon. These conductors 42 may be used as all or part of the lower electrode for device 12 and may perform additional functions (e.g., by serving as a diffusion barrier and/or adhesion layer for an underlying portion of an electrical device such as a diode 36).

Figure 22:
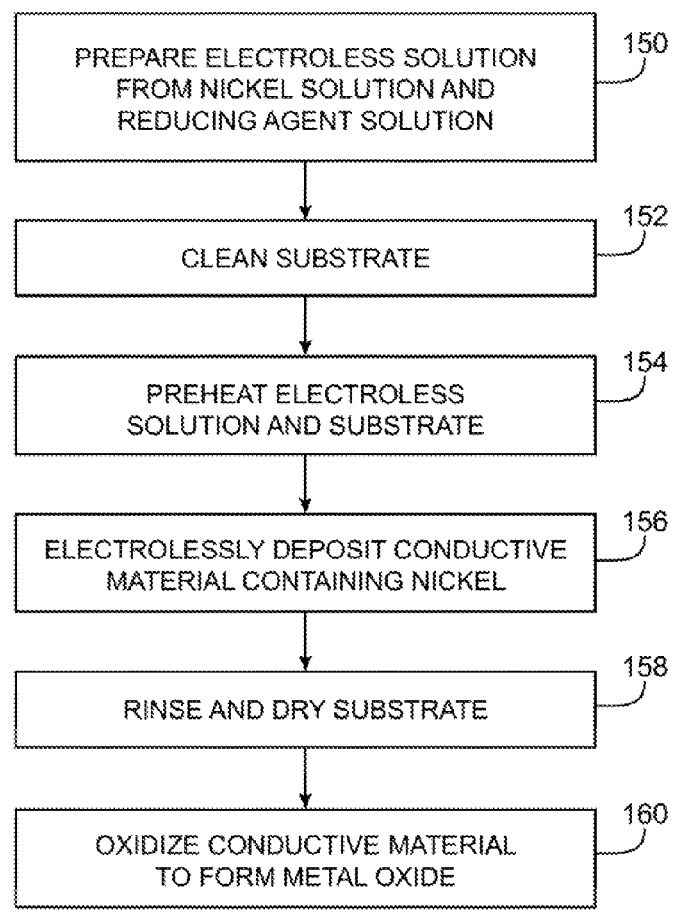
FIG. 22 is a flow chart of illustrative steps involved in selectively electrolessly depositing metal for a resistive switching memory element in accordance with an embodiment of the present invention.

A flow chart of illustrative steps involved in forming electroless conductive layers on conductors 42 which may be formed from transition metal nitrides such as titanium nitride, tungsten nitride, molybdenum nitride, and tantalum nitride or other suitable conductors is shown in FIG. 22.

At step 150, an electroless solution is prepared from a nickel solution and a reducing agent solution. The nickel solution may be prepared by combining a nickel salt, a complexing agent, a pH buffer agent, and a pH adjusting chemical. The reducing agent solution may be prepared by combining a reducing agent, an optional pH adjusting chemical, and an optional complexing agent.

The nickel salt serves as a source of nickel. Illustrative nickel salts that may be used include nickel sulfate and nickel chloride.

The complexing agent, which is sometimes referred to as a chelating agent, may be a polycarboxylic acid such as citric acid, tartaric acid, ammonium citrate, sodium citrate, ethylenediamine, ammonia, other suitable chemicals, or combinations of these chemicals. In a typical scenario, the complexing agent may be citric acid or ammonium citrate.

The pH buffer agent may be ammonium citrate, ammonium chloride, boric acid, ammonium carbonate, ammonium bicarbonate, other suitable chemicals, or combinations of these chemicals. In a typical scenario, the pH buffer agent may be citric acid or ammonium citrate.

The pH adjusting agent may be a chemical such as tetramethylammonium hydroxide (TMAH) or an ammonia solution.

Suitable reducing agents include alkylamine boranes, aromatic-amine boranes, ammonia-amine boranes, amino-amine boranes, hypophosphite acid, other suitable chemicals, or combinations of these chemicals. With one suitable arrangement, the reducing agent may be dimethylamine borane, hypophosphite acid, or ammonium hypophosphite. Electroless films deposited using borane-containing reducing agents contain boron (e.g., nickel with 1-10% boron). Electroless films deposited using hypophosphite-containing reducing agents contain phosphorus (e.g., nickel with 1-10% phosphorus). If desired, elements such as boron, phosphorus, and other metals can be incorporated into an electroless metal film (or other conductive material for forming the resistive switching memory element) using ion implantation.

Optional wetting agents and/or surfactants may be included in the electroless solution such as polyethylene glycol, polyethylene oxide, polyethers, etc.

The electroless solution may also contain optional salts of other metals (e.g., cobalt or chromium) that are to be incorporated in the deposited electroless metal film (i.e., $CoSO_4$ and $CoCl_2$ in the concentration range of 0-10% of that for $NiSO_4$ and $NiCl_2$). The resulting electroless conductive material that is deposited (in this example) will contain cobalt or chromium in addition to nickel.

An illustrative electroless solution that is prepared according to these guidelines might contain nickel sulfate ($NiSO_4$) in the range of 5 mM/l to 0.5 M/l or, 10 mM/l to 0.1 M/l, ammonium citrate or citric acid in the range of 10 mM/l to 1.5 M/l or in the range of 20 mM/l to 0.3 mM/l, ammonium chloride (when citric acid is used as complexing agent) in the range of 10 mM/l to 1.5 M/l or in the range of 20 mM/l to 0.9 M/l, sufficient TMAH as a pH adjusting agent to adjust the pH to the pH range of 9.5-11.5 or to the pH range of 10.0-11.0, and dimethylamine borane in the range of 5 mM/l to 1.5 M/l or in the range 10 mM/l to 0.5 M/l (or hypophosphite acid in the same concentration range). An example of an electroless solution composition that may be used is: 20 mM/l $NiSO_4$, 60 mM/l tri-ammonium citrate, 40 mM/l dimethylamine borane (DMAB), with a TMAH addition to adjust the pH of the solution to 10.5.

To enhance longevity, the nickel solution (e.g., NiSO4, tri-ammonium citrate, and TMAH) and the reducing agent solution (e.g., dimethylamine borane or dimethylamine borane, TMAH and citric acid) may be stored in separate containers and mixed during step 150. This is because solutions containing both a nickel salt and a reducing agent tend to exhibit thermodynamic instability.

At step 152, substrate 44 (and the exposed conductor on substrate 44) may be cleaned in preparation for electroless deposition. Suitable cleaning arrangements include those that use chemical cleaning in aqueous acidic solutions such as 0.1-2.0 M/l $H_2SO_4$, 0.05-1.0 M/l HCl, 0.1-2.0 M/l citric acid, 0.05-1.0 M/l HF, HF+$NH_4$F solutions, or aqueous alkaline solutions containing complexing agents such as ammonia, amines, and amides. An illustrative cleaning temperature range is 20-50° C. to minimize excessive TiN or TaN material loss and excessive surface roughness due to an overly aggressive chemical attack. A typical cleaning procedure might involve cleaning in $H_2SO_4$ or citric acid for 60-120 seconds at room temperature followed by surface rinsing in deionized water and drying with $N_2$ gas. Cleaning may also be performed by rinsing in methanol, ethanol, or isopropanol before drying with $N_2$ gas.

At step 154, the electroless solution that was prepared at step 150 may be preheated. Substrate 44 may also be preheated (e.g., in the reducing agent solution). An illustrative preheating temperature that may be used is 80° C. The electroless solution may be heated to a desired process temperature in a closed vessel to minimize loss of TMAH and ammonia.

At step 156, substrate 44 is immersed in the electroless solution, thereby electrolessly depositing the desired conductive material onto the substrate. Electroless deposition techniques require a conductive surface and do not deposit metal on dielectrics such as silicon oxide. As a result, electroless material is selectively deposited on existing conductors without depositing on surrounding silicon oxide insulating regions. During a typical electroless deposition operation, substrate 44 might be immersed in electroless solution at 80° C. for about 2-5 minutes or less. Other suitable temperature ranges that may be used for the electroless solution include a temperature range of 60-90° C. or a temperature range of 75-85° C.

The electroless deposition process continues until the desired thickness of the electroless film is obtained (e.g., the desired nickel film thickness is obtained). The composition of the electroless film is determined by the components of the electroless solution. Typical compositions include nickel with 1-10% boron, nickel with 1-10% cobalt, and nickel with 1-10% phosphorus. If desired, electroless deposition may be used to form conductive materials that are based on transition metals other than nickel or that are combined with metals other than boron, cobalt, and phosphorus. Multiple electroless films may also be deposited (e.g., in schemes exploiting differential oxidation rates). Step 156 may be performed shortly after step 152 to ensure that the cleaned surface remains fresh prior to immersion in the electroless solution.

After removal from the electroless solution, substrate 44 may be rinsed in deionized water and dried with $N_2$ gas (step 158).

At step 160, the electroless conductive material that has been formed is oxidized. If a molecular masking layer is being used, the molecular masking layer may be removed between steps 158 and 160.

Any suitable oxidation technique may be used to oxidize the electroless conductive material. Techniques that may be used include thermal oxidation, plasma oxidation, and oxygen ion implantation.

Thermal oxidation may be performed by using a furnace or a rapid thermal oxidation (RTO) tool to apply heat in an oxygen-containing gas environments (e.g., rapid thermal oxidation in an $Ar/O_2$ environment). Oxidation parameters may be adjusted to control the oxidation process. Oxidation parameters that may be adjusted include temperature level and thermal anneal duration, temperature ramp-up and ramp-down rates, and oxygen partial pressure. By varying these parameters, different film composition and defect microstructures may be obtained. An example of a suitable anneal temperature is a temperature in the range of 200-800° C.

Plasma oxidation may be performed in an oxygen-containing plasma environment while the substrate is being thermally heated (e.g., to 200-800° C.).

Oxygen ion implantation techniques involve implantation of oxygen ions into the electroless film followed by thermal activation in the temperature range of 200-1000° C.

An advantage of the electroless deposition process described in connection with FIG. 22 is that it allows electroless conductive material to be selectively deposited on patterned conductive regions (e.g., patterned titanium nitride and tantalum nitride) without depositing electroless material on exposed dielectric surfaces. Selective electroless nickel deposition can therefore be realized on patterned TiN and TaN surfaces that are surrounded by silicon oxide isolation regions. When oxidized, the selectively deposited electroless nickel forms patterned nickel-based oxide films (e.g., for metal oxide region 22 of resistive switching memory element 12 of FIGS. 2A and 2B).

Plasma etching of nickel oxide films generally relies on physical sputtering due to the very low volatility of compounds between nickel and etchants that contain halogens (F, Cl, and Br). As a result, etch byproducts tend to form undesired residues during the etching process. In contrast, TiN and TaN can be readily etched using chlorine-containing etchants. These etchants produce volatile etch products (e.g., highly volatile $TiCl_4$ and $TaCl_5$ and the other related products). It is therefore relatively straightforward to pattern TiN and TaN films (e.g., using lithographically patterned photoresist or a hard mask combined with plasma etch). Once patterned, the resistive switching memory element can be formed using the selective electroless deposition process of FIG. 22 and the subsequent oxidation of the electroless material to form a metal oxide.

The foregoing is merely illustrative of the principles of this invention and various modifications can be made by those skilled in the art without departing from the scope and spirit of the invention.

What is claimed is:

1. A method for fabricating an integrated circuit resistive switching memory element comprising:
   forming a first layer of a conductive material on a first portion of a substrate;
   forming a second layer of the conductive material on the first layer using an electroless process; and
   oxidizing the second layer to form a resistive switching metal oxide layer;
   wherein the second layer is doped; and
   wherein the second layer oxidizes at a substantially faster rate than the first layer.

2. The method of claim 1, wherein the conductive material includes nickel.

3. The method of claim 2, wherein the nickel in the second layer is provided by an electroless solution comprising nickel sulfide or nickel chloride.

4. The method of claim 3, wherein the second layer is doped by including a salt of a non-nickel metal in the electroless solution.

5. The method of claim 4, wherein the non-nickel metal comprises cobalt or chromium.

6. The method of claim 4, wherein the salt comprises cobalt sulfide or cobalt chloride.

7. The method of claim 1, wherein the second layer is doped by an ingredient in a reducing solution used in the electroless process.

8. The method of claim 7, wherein the reducing solution comprises borane.

9. The method of claim 7, wherein the reducing solution comprises hypophosphite.

10. The method of claim 1, wherein the second layer is doped by ion implantation.

11. The method of claim 1, wherein the second layer is doped with boron.

12. The method of claim 11, wherein the second layer comprises between about 1% and about 10% boron.

13. The method of claim 1, wherein the second layer is doped with phosphorus.

14. The method of claim 13, wherein the second layer comprises between about 1% and about 10% phosphorus.

15. The method of claim 1, wherein the first layer is doped with phosphorus and the second layer is doped with boron.

16. The method of claim 1, wherein the second layer is doped with cobalt.

17. The method of claim 1, wherein the second layer is doped with chromium.

18. The method of claim 1, wherein the electroless process comprises preheating the electroless solution before the forming of the second layer.

19. The method of claim 1, wherein the electroless process comprises rinsing in deionized water and drying in nitrogen gas after the forming of the second layer.

20. The method of claim 1, further comprising:
   selectively forming a molecular masking layer on a second portion of the substrate before forming the second layer; and
   removing the molecular masking layer before oxidizing the second layer;
   wherein the forming of the second layer is not desired on the second portion of the substrate.

* * * * *